(12) United States Patent
Kencke et al.

(10) Patent No.: US 6,313,487 B1
(45) Date of Patent: Nov. 6, 2001

(54) VERTICAL CHANNEL FLOATING GATE TRANSISTOR HAVING SILICON GERMANIUM CHANNEL LAYER

(75) Inventors: David L. Kencke, Portland, OR (US); Sanjay K. Banerjee, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 09/596,006

(22) Filed: Jun. 15, 2000

(51) Int. Cl.[7] .......................... H01L 29/788; H01L 29/12
(52) U.S. Cl. .......................... 257/192; 257/191; 257/316; 257/616
(58) Field of Search .................................. 257/191, 192, 257/316, 322, 616

(56) References Cited

U.S. PATENT DOCUMENTS

| | | |
|---|---|---|
| 4,499,557 | 2/1985 | Holmberg et al. .................... 365/163 |
| 4,599,705 | 7/1986 | Holmberg et al. .................... 365/163 |
| 4,870,470 | 9/1989 | Bass, Jr. et al. ..................... 357/23.5 |
| 5,162,880 | 11/1992 | Hazama et al. ....................... 257/106 |
| 5,272,365 * | 12/1993 | Nakagawa ............................ 257/192 |
| 5,334,855 | 8/1994 | Moyer et al. ........................... 257/13 |
| 5,341,328 | 8/1994 | Ovshinsky et al. .................. 365/163 |
| 5,349,209 | 9/1994 | Moyer et al. ............................ 257/80 |
| 5,432,356 | 7/1995 | Imamura ................................. 257/24 |
| 5,451,800 * | 9/1995 | Mohammad .......................... 257/192 |
| 5,534,712 | 7/1996 | Ovshinsky et al. ...................... 217/3 |
| 5,534,713 * | 7/1996 | Ismail et al. .......................... 257/192 |
| 5,546,340 | 8/1996 | Hu et al. .............................. 365/185.3 |
| 5,659,504 | 8/1997 | Bude et al. ........................ 365/185.27 |
| 5,698,869 | 12/1997 | Yoshimi et al. ...................... 257/192 |
| 5,801,396 | 9/1998 | Chan et al. ............................... 257/65 |
| 5,818,761 | 10/1998 | Onakado et al. ................ 365/185.13 |
| 5,821,136 | 10/1998 | Chan et al. ............................. 438/158 |
| 5,821,577 * | 10/1998 | Crabbe et al. ........................ 257/192 |
| 5,901,084 | 5/1999 | Ohnakado ........................ 365/185.18 |
| 5,926,414 | 7/1999 | McDowel et al. .................... 365/170 |
| 5,969,384 * | 10/1999 | Hong .................................... 257/322 |
| 5,986,581 | 11/1999 | Magdaleno, II et al. ............ 340/953 |
| 5,991,200 | 11/1999 | Seki et al. ........................ 365/185.18 |
| 6,013,950 | 1/2000 | Nasby ...................................... 257/34 |
| 6,031,263 | 2/2000 | Forbes et al. ......................... 257/315 |
| 6,204,123 * | 3/2001 | Mori ...................................... 257/316 |
| 6,207,978 * | 3/2001 | Fastow ................................. 257/192 |

* cited by examiner

*Primary Examiner*—Gene M. Munson
(74) *Attorney, Agent, or Firm*—Townsend and Townsend and Crew LLP; Henry K. Woodward

(57) ABSTRACT

A vertical channel flash memory cell with a silicon germanium layer in the channel region provides enhanced secondary electron injection when programming the device. The device includes a silicon substrate, a silicon germanium alloy layer epitaxially grown on the substrate, and a silicon layer epitaxially grown on the silicon germanium layer. A sidewall through the stacked structure is formed by etching thereby exposing edges of the silicon layer and the silicon germanium layer and a portion of the substrate. A floating gate is formed overlying the sidewall and insulated therefrom with a control gate overlying the floating gate and insulated therefrom. A source region is formed in the silicon layer and a drain region is formed in the substrate with a channel therebetween along the sidewall and including the silicon germanium layer. The silicon germanium layer is preferably compressively strained and can have a uniform mole fraction or a graded mole fraction. The vertical structure permits the fabrication of flash memory cells with smaller dimensions and lower operating voltages.

20 Claims, 3 Drawing Sheets

VERTICAL CHANNEL FLOATING GATE TRANSISTOR HAVING SILICON GERMANIUM CHANNEL LAYER

CROSS-REFERENCES TO RELATED APPLICATIONS

This patent application is related to copending application Serial No. 04/595,366 filed concurrently herewith, for FLOATING GATE TRANSISTOR HAVING BURIED STRAINED Si-Ge CHANNEL LAYER.

BACKGROUND OF THE INVENTION

This invention relates generally to insulated gate field effect transistors (IGFET) and metal oxide silicon transistors (MOSFET), and more particularly the invention relates to such transistors having a floating gate for use in electrically erasable, programmable read only memory (EEPROM) cells and flash EEPROM cells.

The MOSFET transistor has source and drain regions separated by a channel region with the conduction of the channel region controlled by voltage biasing an overlying control gate. The flash EEPROM device has the structure of a MOSFET but includes an electrically isolated gate, or floating gate, between the control gate and the channel region for storing charge. Controlling the amount of charge on the floating gate alters the threshold voltage and creates a nonvolatile memory function. Flash memory development is therefore driven by some of the same concerns as MOS technology, but in addition to the demands for scalable devices with high access times and low leakage currents it adds to the requirement of efficient, controllable gate currents and channel hot electron (CHE) programming as used in conventional flash cells. However, as the drain and gate voltages are lowered the CHE programming becomes less efficient.

Another concern for both flash memories and MOSFET devices is the challenge of defining planar features, especially channel lengths at smaller dimensions. To overcome the limitations of determining the channel length by lithographic methods, vertical channel devices have been proposed in which the channel is formed on the sidewall of a trench, mesa or pillar. The length of the channel is then determined by epitaxial layer growth or etch rates in the devices.

Since flash memory is used mostly in mobile applications, low power operation is desirable. For programming with lower drain and gate voltages, a negative substrate voltage may be applied that produces a different programming mechanism that is more effective than the CHE programming at the lower voltages. Channel initiated secondary electron (CHISEL) injection occurs when a substrate bias is applied, and the mechanism is also known as substrate current induced hot electron (SCHE) injection. Channel electrons gain energy as they travel to the drain and produce primary impact ionization. The holes generated in the drain then travel back across the drain junction and gain energy as they pass through the depletion region where they can produce a secondary impact ionization (SII). The secondary electrons created by SII can travel back to the Si-SiO$_2$ interface and be injected into the floating gate.

The present invention is directed to a flash memory cell and EEPROM device having a vertical channel and employing channel initiated secondary electron injection for programming.

SUMMARY OF THE INVENTION

In accordance with the invention a field effect transistor comprises a semiconductor body with source and drain regions separated vertically by a channel region comprising a Si$_x$Ge$_{1-x}$ layer. The device is fabricated by epitaxially growing a silicon germanium alloy layer on a silicon substrate, and then growing a layer of silicon on the silicon germanium alloy layer to form a heterojunction with the alloy layer. A trench, mesa, pillar or like structure is then formed by etching to expose a sidewall of the silicon germanium layer. A gate dielectric is grown or deposited on the sidewall, and a floating gate material is then deposited and patterned. An inter-gate dielectric is then grown or deposited, and a source and drain are formed such as by ion implantation. A control gate is then formed on the inter-gate dielectric over the floating gate.

In preferred embodiments, the epitaxial silicon germanium layer is compressively strained with the mole fraction, 1−x, either uniform or graded. A silicon layer can be epitaxially grown on the sidewall and function as a cap layer for the channel.

The heterojunction of the vertical channel enhances secondary electron injection due to the smaller Si—Ge bandgap, thus requiring less energy in creating electron-hole pairs. Further, holes generated by primary impact ionization in the drain and traveling toward the substrate gain additional energy from the valence band offset at the heterostructure interface and therefore are more likely to produce a greater amount of secondary ion injection closer to the silicon-silicon oxide surface. The silicon germanium layer also helps by producing a heterostructure that redirects the flow of the substrate current away from the source junction, and thus avoids a bipolar-type breakdown that occurs when holes of the substrate current are injected into the source region.

The invention and objects and features thereof will be more readily apparent from the following detailed description and appended claims when taken with the drawing.

BRIEF DESCRIPTION OF THE DRAWINGS

Like elements in the figures have the same reference numerals.

DESCRIPTION OF ILLUSTRATIVE EMBODIMENTS

Figure 1:
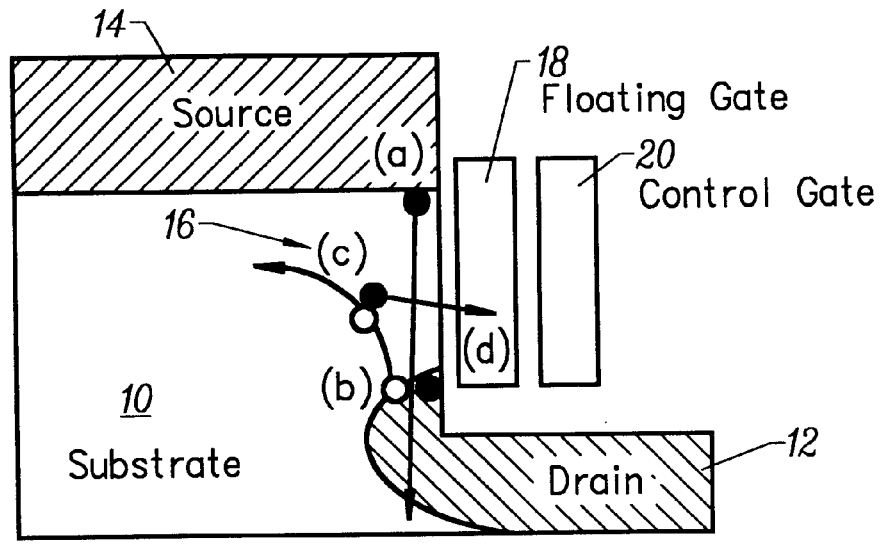
FIG. 1 is a section view illustrating channel initiated secondary electron injection in a vertical channel flash memory device.

Referring now to the drawings, FIG. 1 is a section view illustrating a prior art vertical channel field effect transistor device comprising a P-doped silicon substrate 10 in which an N-doped drain region 12 and an N-doped source region 14 are formed with a channel region shown generally at 16 therebetween. A floating gate 18 is spaced from channel 16 by a gate dielectric layer, and a control gate 20 is spaced from floating gate 18 by an inter-gate dielectric such as silicon oxide.

Channel initiated secondary electron (CHISEL) injection in the vertical channel of the device occurs when channel electrons at (a) gain energy and produce primary impact ionization at the drain (b), and the resulting holes in the substrate current may produce secondary impact ionization at (c). The generated secondary electrons can form a secondary electron gate current (d) that is significantly enhanced by a negative substrate bias.

The structure of FIG. 1 is formed by etching a trench, mesa, or pillar in substrate 10 and then forming floating gate 18 over a gate dielectric on the sidewall. Drain 12 and source 14 are then formed by ion implantation, and gate 20 is then formed over an inter-gate dielectric on the floating gate 18. The length of the channel is determined by depth of the trench, mesa or pillar.

Figure 2:
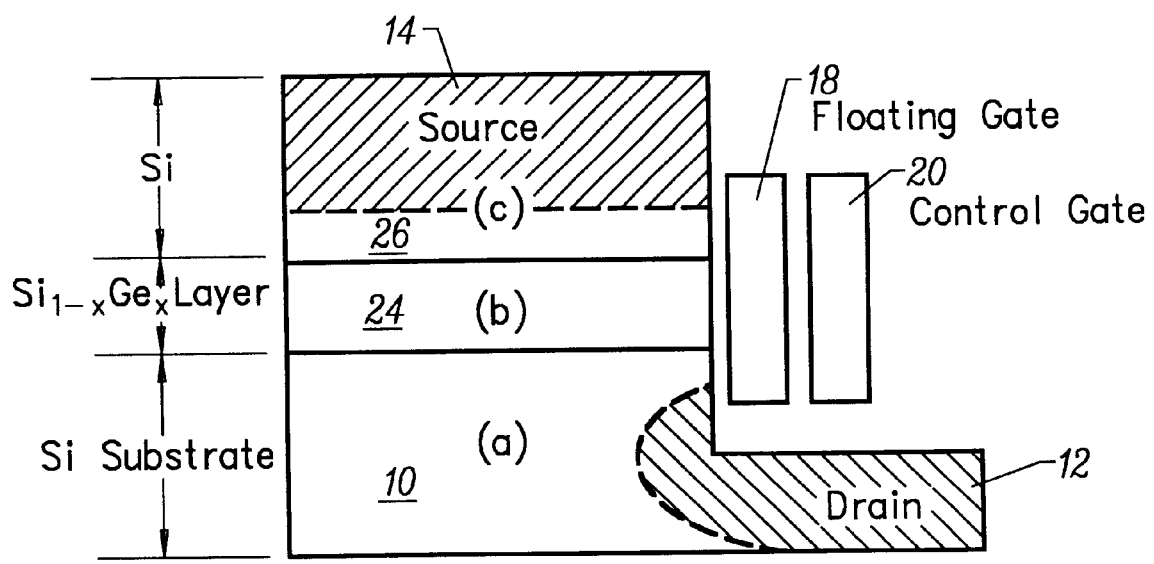
FIG. 2 is a section view of a vertical channel floating gate field effect transistor device in accordance with one embodiment of the invention.

FIG. 2 is a section view of a vertical channel FET transistor with floating gate and control gate in accordance with one embodiment of the invention. In this embodiment a $Si_xGe_{1-x}$ layer 24 is epitaxially grown on the surface of substrate 10 and then a silicon layer 26 is epitaxially grown on the top of the silicon germanium layer. Again, a trench, mesa, pillar, or like structure is formed by etching to expose a sidewall including the SiGe layer 24, and then gate oxide is formed over the sidewall and floating gate 18 of doped polysilicon, for example, is then formed. Drain 12 and source 14 are then formed by ion implantation, an inter-gate dielectric is formed over floating gate 18, and then control gate 20 is formed by a second doped polysilicon layer, for example.

In a preferred embodiment, the silicon germanium layer 24 is compressively strained with the $Si_xGe_{1-x}$ layer of uniform composition or the mole fraction 1−x may be graded. The whole layer is kept below a critical thickness and maintains pseudomorphic strain.

Figure 3:
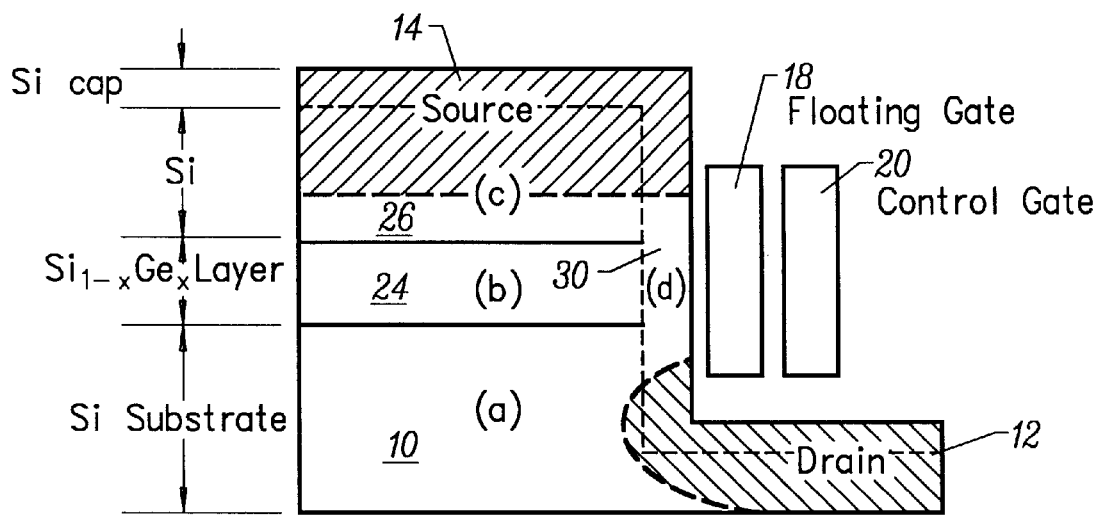
FIG. 3 is a section view of a vertical channel floating gate field effect transistor in accordance with another embodiment of the invention.

FIG. 3 is a section view illustrating another embodiment of the floating gate field effect transistor device in accordance with the invention in which an additional thin layer 30 of silicon is epitaxially grown on the sidewall over the exposed SiGe layer substrate 10 and silicon layer 26. Silicon layer 30 serves as a cap layer for the channel region of the transistor. Silicon layer 30 is strained with an unusual configuration in which all three sides of the unit cell are different lengths, which is called orthorhombic strain. Finally, again, a gate dielectric is grown or deposited over the exposed sidewall, the floating gate material is deposited and patterned, an inter-gate dielectric is grown or deposited, the drain 12 and source 14 are formed by ion implantation, and a control gate material is deposited over an inter-gate dielectric.

Figure 4:
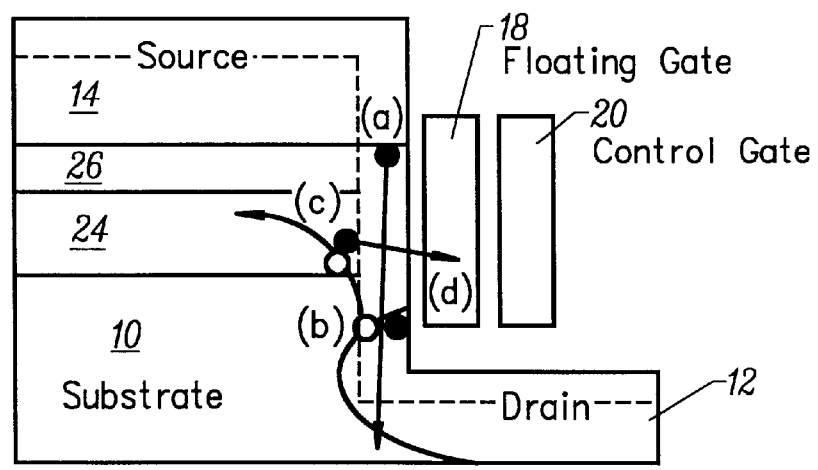
FIG. 4 illustrates secondary electron injection in the device of FIG. 3.

FIG. 4 is a section view of the device of FIG. 3 and illustrates enhancement of the secondary electron injection mechanism in the transistor in accordance with the invention. Channel electrons (a) produce primary impact ionization (b) in the silicon drain region, and the resulting holes gain energy in the silicon region 30 and produce secondary electron injection in the SiGe layer 24. The secondary electrons then may be injected into the floating gate (d) as the holes escape into the negatively biased substrate 10.

Thus, the heterostructure formed with the silicon germanium alloy layer 24 enhances secondary electron injection gate current since the silicon germanium bandgap is smaller and the energy needed to create electron hole pairs can be smaller. The lower threshold for impact ionization in the SiGe layer produces more secondary electrons closer to the Si—$SiO_2$ than a device without the alloy layer. Further, the holes generated by primary impact ionization in the drain and traveling toward the substrate gain additional energy from the valence band offset at the heterostructure interface and therefore are more likely to produce a greater amount of secondary electron injection closer to the Si—$SiO_2$ surface near the floating gate.

Simulation of the channel initiated secondary electron injection indicates an enhanced gate current with the device in accordance with the invention. A multiple stage Monte Carlo simulation method (IEEE IEDM Technology Digest, p. 889, 1998) was modified with simple models to account for $Si_xGe_{1-x}$ offsets, and scattering mechanisms. Devices with 0.18 μm gate lengths were simulated. The devices were simulated with uniform substrate doping of $6 \times 10^{17}$ cm$^{-3}$ thin 40 Å gate oxides, and shallow drain junctions (50 nm) that had lateral junctions 25 nm away from the beginning of the $Si_xGe_{1-x}$ layer. $Si_xGe_{1-x}$ critical layer thicknesses of 120, 60, 20, 10, and 5 nm were assumed for uniform mole fractions, x, of 20, 30,40,50, and 60%, respectively. Devices were simulated with and without a 15 nm Si cap thickness. These devices were simulated with 1.8 V on the gate, 2.7 V on the drain, and −2.7 V on the substrate.

Figure 5:
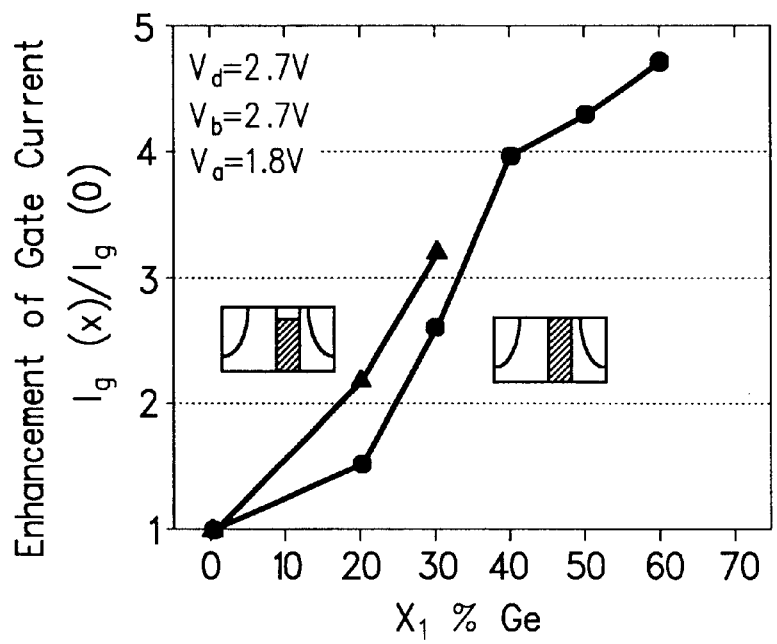
FIG. 5 is a plot of enhancement of gate current to percentage of germanium in the silicon germanium layer in the channel region.

The $Si_xGe_{1-x}$ flash devices showed improved gate injection up to 4.7 times (FIG. 5). For layers with a maximum Ge mole fraction of 0.4, an analysis of the injection mechanism showed that the majority (84%) of the CHISEL injection was formed by secondary electrons originating in the $Si_xGe_{1-x}$ layer.

Figure 6:
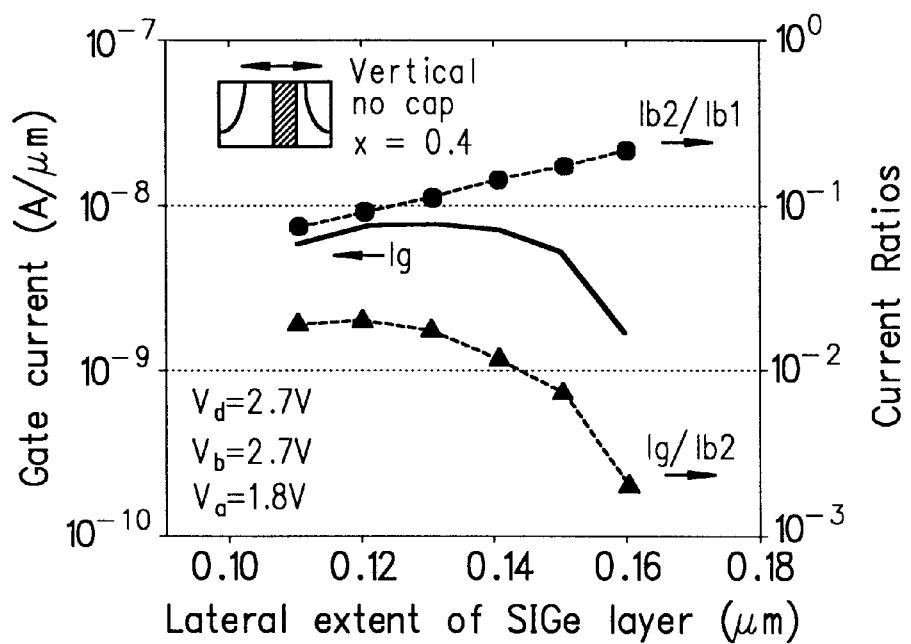
FIG. 6 is a plot of gate current and current ratios versus lateral extent of the silicon germanium layer illustrating dependence of gate injection on the placement of the silicon germanium layer.

Inclusion of the silicon germanium epitaxial layer in the vertical channel field effect transistor in accordance with the invention provides better device characteristics as cell size scales down. The offset in the valence band of the alloy layer gives holes in the substrate current a greater energy to produce secondary impact ionization and has a smaller bandgap which further enhances impact ionization. The alloy layer can be optimized in position and thickness to better control the programming gate current as illustrated in FIG. 6. Here dependence on the gate injection on the placement of $Si_xGe_{1-x}$ layer is illustrated by a solid line. The Ge mole fraction layer of the layer is 0.4. The ratios of total primary to secondary impact ionization (circles) and gate current to total secondary impact ionization (triangles) are also shown.

Further, the alloy layer redirects substrate current away from the source junction, thus preventing the injection of holes that can initiate bipolar breakdown. The separate silicon cap grown on the sidewall can be separately engineered from the region where secondary electrons are created. Furthermore, the sidewall silicon region can be orthorhombically strained and have higher mobility in the channel direction as a higher saturation velocity, thus giving the device higher read currents as well as producing impact ionization in the drain at lower voltages. Since alloy scattering has been theoretically seen to prevent the enhancement of impact ionization in SiGe alloys, the provision of the silicon cap layer alloys holes to gain energy before they cross into the SiGe layer. Thus, holes accelerate in the silicon region but produce the silicon impact ionization in the separate silicon germanium alloy region.

The heterostructure solves some problems of flash memory arrays as size and voltages are scaled. At lower drain voltages, channel hot electron (CHE) programming becomes less effective, but the structure in accordance with the invention allows secondary electron injection to be used instead. In addition, leakage currents become magnified as more devices are included in larger arrays, but the lower voltages and the substrate voltage used in the invention produce less leakage current during programming.

The strained heterostructure layers add some complexity to the fabrication process since the epitaxial layers require more processing. However, these additional steps are taken at the beginning of the process flow, and as strained layer technology becomes widespread, such steps will become routine. An important limitation is that the subsequent thermal budget should be restricted to avoid relaxation in the metastable strained SiGe alloy layer.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A field effect transistor comprising:
   a) a silicon substrate,
   b) an epitaxial silicon germanium layer grown on a surface of the substrate,
   c) an epitaxial silicon layer grown on a surface of the silicon germanium layer,
   d) a sidewall exposing the silicon layer, the silicon germanium layer, and a portion of the substrate,
   e) a first gate dielectric formed on the sidewall,
   f) a floating gate formed on the first gate dielectric over the sidewall,
   g) a second gate dielectric formed over the floating gate,
   h) a control gate formed on the second gate dielectric and over the control gate,
   i) a source region formed in the epitaxial silicon layer, and
   j) a drain region formed in the substrate, whereby a channel is provided between the source and drain along the sidewall.

2. A field effect transistor as defined by claim 1 wherein the epitaxial silicon germanium layer is compressively strained.

3. A field effect transistor as defined by claim 2 wherein the epitaxial silicon germanium layer has a uniform mole fraction.

4. A field effect transistor as defined by claim 2 wherein the epitaxial silicon germanium layer has a graded mole fraction from $1-x=0$ at the substrate to $1-x=a$ maximum value for a $Si_xGe_{1-x}$.

5. The field effect transistor as defined by claim 2 wherein the thickness of the silicon germanium layer is below a critical value to maintain pseudomorphic strain.

6. The field effect transistor as defined by claim 2 and further including:
   k) a silicon cap layer epitaxially grown on the sidewall.

7. The field effect transistor as defined by claim 6 wherein the epitaxial silicon germanium layer is compressively strained.

8. The field effect transistor as defined by claim 6 wherein the epitaxial silicon germanium layer has a uniform mole fraction.

9. The field effect transistor as defined by claim 6 wherein the epitaxial silicon layer has a graded mole fraction from $1-x=0$ at the substrate to $1-x=a$ maxium value for a $Si_xGe_{1-x}$ layer.

10. The field effect transistor as defined by claim 6 wherein the thickness of the silicon germanium layer is below a critical value to maintain pseudomorphic strain.

11. A vertical channel flash memory device comprising:
    a) a stacked silicon substrate, a silicon germanium alloy layer epitaxially grown on the substrate, and a silicon layer epitaxially grown on the silicon germanium layer,
    b) a sidewall through the stacked structures exposing edges of the silicon layer and silicon germanium layer and a portion of the substrate,
    c) a floating gate overlying the sidewall and insulated therefrom,
    d) a control gate overlying the floating gate and insulated therefrom, and
    e) a source region in the silicon layer and a drain in the substrate with a channel therebetween along the sidewall and including the silicon gemanium layer.

12. The device as defined by claim 11 wherein the epitaxial silicon germanium layer is compressively strained.

13. The device as defined by claim 12 wherein the epitaxial silicon germanium layer has a uniform mole fraction.

14. The device as defined by claim 12 wherein the epitaxial silicon germanium layer has a graded mole fraction from $1-x=0$ at the substrate to $1-x=a$ maximum value for a $Si_xGe_{1-x}$ layer.

15. The device as defined by claim 12 wherein the thickness of the silicon germanium layer is below a critical value to maintain pseudomorphic strain.

16. The device as defined by claim 11 and further including:
    k) a silicon cap layer epitaxially grown on the sidewall.

17. The device as defined by claim 16 wherein the epitaxial silicon germanium layer is compressively strained.

18. The device as defined by claim 16 wherein the epitaxial silicon germanium layer has a uniform mole fraction.

19. The device as defined by claim 16 wherein the epitaxial silicon germanium layer has a graded mole fraction from $1-x=0$ at the substrate to $1-x=a$ maximum value for a $Si_xGe_{1-x}$ layer.

20. The device as defined by claim 16 wherein the thickness of the silicon germanium layer is below a critical value to maintain pseudomorphic strain.

* * * * *